US011894335B2

(12) United States Patent
Yamada et al.

(10) Patent No.: US 11,894,335 B2
(45) Date of Patent: Feb. 6, 2024

(54) DISPLAY DEVICE AND METHOD FOR MANUFACTURING THE SAME

(71) Applicant: Japan Display Inc., Tokyo (JP)

(72) Inventors: Kazuyuki Yamada, Tokyo (JP); Keisuke Asada, Tokyo (JP); Kenichi Takemasa, Tokyo (JP)

(73) Assignee: Japan Display Inc., Tokyo (JP)

( * ) Notice: Subject to any disclaimer, the term of this patent is extended or adjusted under 35 U.S.C. 154(b) by 232 days.

(21) Appl. No.: 17/337,626

(22) Filed: Jun. 3, 2021

(65) Prior Publication Data

US 2021/0398939 A1 Dec. 23, 2021

(30) Foreign Application Priority Data

Jun. 19, 2020 (JP) ................. 2020-105961

(51) Int. Cl.
*H01L 33/62* (2010.01)
*H01L 25/16* (2023.01)
*H01L 23/00* (2006.01)

(52) U.S. Cl.
CPC ............. *H01L 24/80* (2013.01); *H01L 24/08* (2013.01); *H01L 25/167* (2013.01); *H01L 33/62* (2013.01); *H01L 24/05* (2013.01); *H01L 2224/05611* (2013.01); *H01L 2224/05644* (2013.01); *H01L 2224/08145* (2013.01); *H01L 2224/08502* (2013.01); *H01L 2224/80004* (2013.01); *H01L 2224/80024* (2013.01); *H01L 2224/8085* (2013.01); *H01L 2224/80224* (2013.01); *H01L 2224/80805* (2013.01); *H01L 2224/80907* (2013.01); *H01L 2924/12041* (2013.01); *H01L 2924/1426* (2013.01)

(58) Field of Classification Search
None
See application file for complete search history.

(56) References Cited

U.S. PATENT DOCUMENTS

| | | | |
|---|---|---|---|
| 5,829,125 A * | 11/1998 | Fujimoto | H01L 25/18 |
| | | | 219/121.64 |
| 7,005,880 B1 | 2/2006 | Buss et al. | |
| 10,186,549 B1 * | 1/2019 | Cheung | H01L 33/005 |
| 10,998,286 B1 * | 5/2021 | Brodoceanu | H01L 33/405 |
| 11,255,529 B1 * | 2/2022 | Wu | H01L 24/02 |
| 11,404,607 B2 * | 8/2022 | Yanagisawa | G09G 3/32 |
| 2003/0197277 A1 | 10/2003 | Yamamoto et al. | |

(Continued)

FOREIGN PATENT DOCUMENTS

CN    111373554 A  *  7/2020  ............. B23K 26/21
KR    1020060006512 A    1/2006

OTHER PUBLICATIONS

Office Action dated Aug. 30, 2023, in corresponding Chinese Application No. 202110597966.8, 10 pages.

*Primary Examiner* — Scott B Geyer
(74) *Attorney, Agent, or Firm* — Maier & Maier, PLLC

(57) ABSTRACT

A method for manufacturing a display device includes preparing a circuit board including a drive circuit for driving a LED chip, forming a connecting electrode on the circuit board, forming an adhesive layer on the connecting electrode, adhering a terminal electrode of the LED chip on the adhesive layer and joining the connecting electrode and the terminal electrode by irradiating a laser light. The adhesive layer may be formed only on a upper surface of the connecting electrode.

8 Claims, 11 Drawing Sheets

(56) References Cited

U.S. PATENT DOCUMENTS

| | | | |
|---|---|---|---|
| 2017/0215280 A1* | 7/2017 | Chaji | H01L 21/6835 |
| 2018/0031974 A1 | 2/2018 | Prevatte et al. | |
| 2018/0069149 A1* | 3/2018 | Zou | H01L 33/20 |
| 2018/0301433 A1* | 10/2018 | Robin | H01L 25/0753 |
| 2019/0304960 A1* | 10/2019 | Ko | H01L 24/06 |
| 2019/0363221 A1* | 11/2019 | Hu | H01L 24/80 |
| 2020/0111939 A1* | 4/2020 | Brodoceanu | H01L 24/81 |
| 2020/0243478 A1* | 7/2020 | Hsieh | H01L 24/95 |
| 2020/0313035 A1* | 10/2020 | Lee | H01L 24/83 |
| 2021/0119098 A1* | 4/2021 | Kajiyama | H01L 25/0753 |
| 2021/0320236 A1* | 10/2021 | Joo | H01L 33/62 |
| 2021/0335752 A1* | 10/2021 | Huang | H01L 33/0093 |
| 2022/0068999 A1* | 3/2022 | Lai | H01L 33/62 |

\* cited by examiner

DISPLAY DEVICE AND METHOD FOR MANUFACTURING THE SAME

CROSS REFERENCE TO RELATED APPLICATIONS

This application is based on and claims the benefit of priority from the prior Japanese Patent Application No. 2020-105961, filed on Jun. 19, 2020, the entire contents of which are incorporated herein by reference.

FIELD

One embodiment of the present invention relates to a manufacturing method of a display device. In particular, the present invention relates to a manufacturing method of a display device on which an LED (Light Emitting Diode) chip is mounted.

BACKGROUND

Recently, as a next-generation display device, an LED display in which a minute LED chip is mounted on each pixel has been developed. Normally, an LED display has a structure in which a plurality of LED chips is mounted on a circuit board constituting a pixel array. The circuit board has driving circuits for emitting the LED at a position corresponding to each pixel. Each of these driving circuits is electrically connected to each LED chip.

The aforementioned driving circuits and the LED chip are electrically connected via a connecting electrode. Specifically, an electrode pad provided on the driving circuit side and an electrode pad provided on the LED chip side are electrically connected. For example, U.S. Unexamined Patent Application Publication No. 2018/0031974 describes a technique for joining LED chips and circuit boards using an adhesive layer. In this technique, the LED chips and the circuit boards are joined by using an adhesive layer. Therefore, an electrode pad of the LED chip side is provided with a conductive protrusion. When the protrusion penetrates the adhesive layer and contact with the electrode pad on the circuit board side, the electrode pad on the LED chip side and the electrode pad on the circuit board side are electrically connected.

SUMMARY

A method for manufacturing a display device according to an embodiment of the present invention includes preparing a circuit board including a drive circuit for driving a LED chip, forming a connecting electrode on the circuit board, forming an adhesive layer on the connecting electrode, adhering a terminal electrode of the LED chip on the adhesive layer and joining the connecting electrode and the terminal electrode by irradiating a laser light.

A display device according to an embodiment of the present invention includes a circuit board including a drive circuit for driving a LED chip, a connecting electrode on the circuit board; and a LED chip including a terminal electrode joined to the connecting electrode. An alloy layer that joins the connecting electrode to the terminal electrode or a surrounding area of the alloy layer has a higher concentration of carbon than the connecting electrode and the terminal electrode.

DESCRIPTION OF EMBODIMENTS

Figure 1:
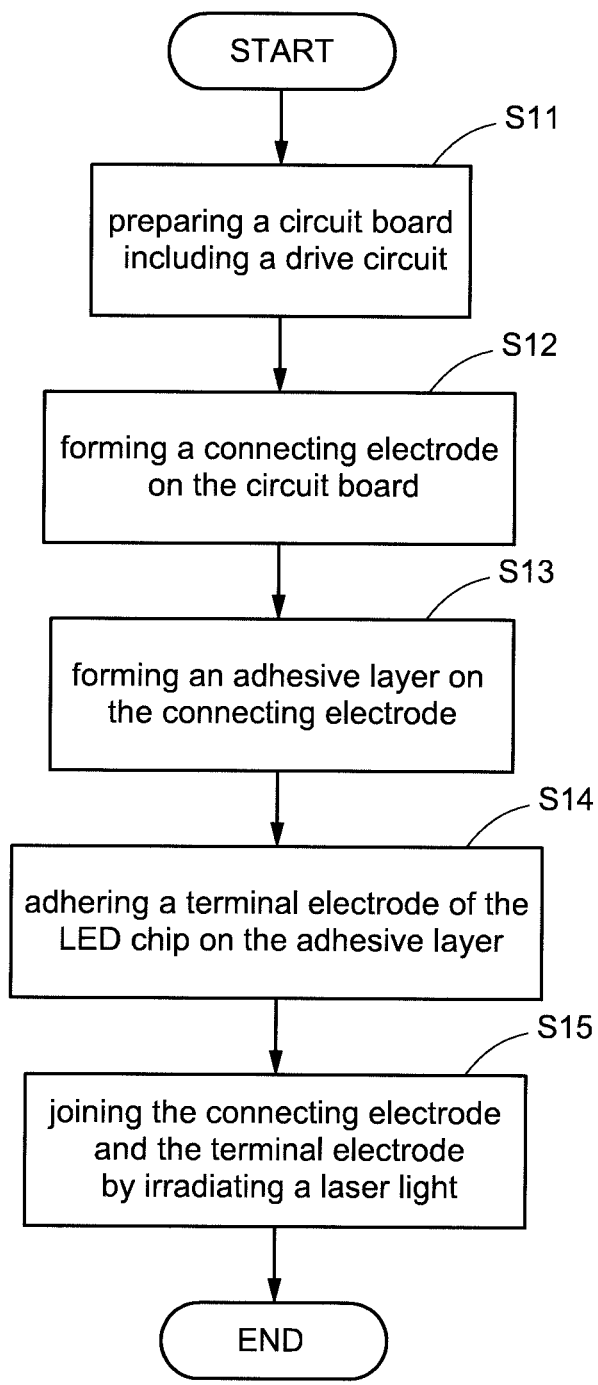
FIG. 1 is a flowchart diagram of a manufacturing method of a display device according to an embodiment of the present invention.

In the above conventional technique, since an adhesive layer is provided on the entire surface of a circuit board, there is a possibility that semiconductor elements constituting a circuit are contaminated by alkaline components contained in an organic material or the like, and operation failure may occur. Further, a complex processing technique of forming a three-dimensional protrusion on the electrode pad on an LED chip side is required.

One of the problems of the present invention is to join the LED chip to the circuit board by a simple method while preventing misregistration of the LED chip before joining.

Embodiments of the present invention will be described below with reference to the drawings and the like. The present invention can be implemented in various modes without departing from the gist thereof. The present invention is not to be construed as being limited to the description of the following exemplary embodiments. For the sake of clarity of description, the drawings may be schematically represented with respect to widths, thicknesses, shapes, and the like of the respective portions in comparison with actual embodiments. The drawings, however, are merely examples and do not limit the interpretation of the present invention.

In describing the present embodiment, the direction from the circuit board to the LED chip is "up" and the opposite direction is "down". However, the expression "above" or "below" merely describes the vertical relationship of each element. For example, the expression that the LED chip is arranged over a circuit board also involves other members between the circuit board and the LED chip. Furthermore, the expression "above" or "below" include not only the case in which the elements overlap but also the case in which they do not overlap in a plan view.

In the description of the embodiment of the present invention, components having the same functions as those of the elements already described are denoted by the same reference numerals or the same reference numerals with symbols such as alphabets, and the description thereof may be omitted. If an element needs to be described separately for each color of RGB, it is distinguished by the letter R, G or B followed by the reference numerals indicating the element. However, when it is not necessary to describe the elements separately for each color of RGB, only the reference numerals indicating the elements will be used for the description.

[Manufacturing Method of Display Device]

FIG. 1 is a flowchart diagram showing a manufacturing method of a display device 100 according to an embodiment of the present invention. FIGS. 2 to 7 are cross-sectional views showing the manufacturing method of the display device 100 according to an embodiment of the present invention. Hereinafter, the manufacturing method of the display device 100 will be described with reference to FIG. 1. If necessary, the cross-sectional structure in each manufacturing process will be described with reference to FIGS. 2 to 7.

First, in step S11, a circuit board 101 including an driving circuit for driving the LED chip is prepared (step S11). The circuit board 101 is a so-called active matrix board. That is, the circuit board 101 has a section corresponding to a plurality of pixels and includes a plurality of thin-film transistors (TFTs) corresponding to each pixel. The driving circuit for driving the LED chip includes a plurality of circuit elements. Each circuit element is formed corresponding to each pixel. Detailed construction of the circuit board 101 will be described later.

In this embodiment, the circuit board 101 is prepared by forming a driving circuit composed of the thin-film transistor on a glass substrate or a resin substrate or the like. However, the present invention is not limited to this example, the circuit board 101 can be prepared by acquiring the conventional circuit board 101 from a third party. In the present embodiment, for example, the circuit board 101 for mounting a flip-chip type LED chip 201 (see FIG. 11) will be described. However, the LED chip 201 is not limited to the flip-chip type having two electrodes on a surface facing the circuit board 101. For example, the LED chip 201 may be constructed having an anode (or cathode) on a side closer to the circuit board 101 and a cathode (or anode) on a side farther from the circuit board 101. That is, the LED chip 201 may be a face-up type LED chip having a structure sandwiching a light emitting layer between the anode electrode and the cathode electrode.

Figure 2:
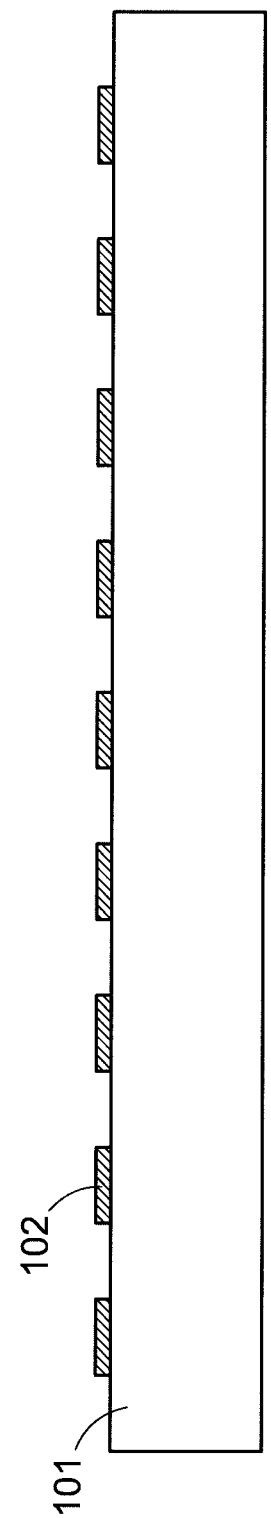
FIG. 2 is a cross-sectional view of a manufacturing process of a display device according to an embodiment of the present invention.

Next, in step S12, as shown in FIG. 2, a connecting electrode 102 is formed on the circuit board 101. In the present embodiment, for example, an example in which the flip-chip type LED chip 201 is mounted on nine connecting electrodes 102 is shown. Although FIG. 2 shows an example in which one connecting electrode 102 is arranged in each pixel for convenience of explanation, in practice, at least two connecting electrodes 102 are formed in each pixel. The LED chip has an terminal electrode connected to an N-type semiconductor and an terminal electrode connected to a P-type semiconductor. Therefore, when one LED chip is arranged in each pixel, at least two connecting electrodes 102 are required for each pixel. However, when the face-up type LED chip described above is used as the LED chip 201, it is sufficient that at least one connecting electrode 102 is formed on the circuit board 101 for each pixel.

The connecting electrode 102 is made of, for example, a metal material having conductivity. In the present embodiment, tin (Sn) is used as the metal material. However, the present invention is not limited to this example, it is possible to use other metal materials capable of forming a eutectic alloy between the terminal electrode on the LED chip-side to be described later. The thickness of the connecting electrode 102 may be, for example, 0.2 μm or more and 5 μm or less (preferably 1 μm or more and 3 μm or less).

Figure 3:
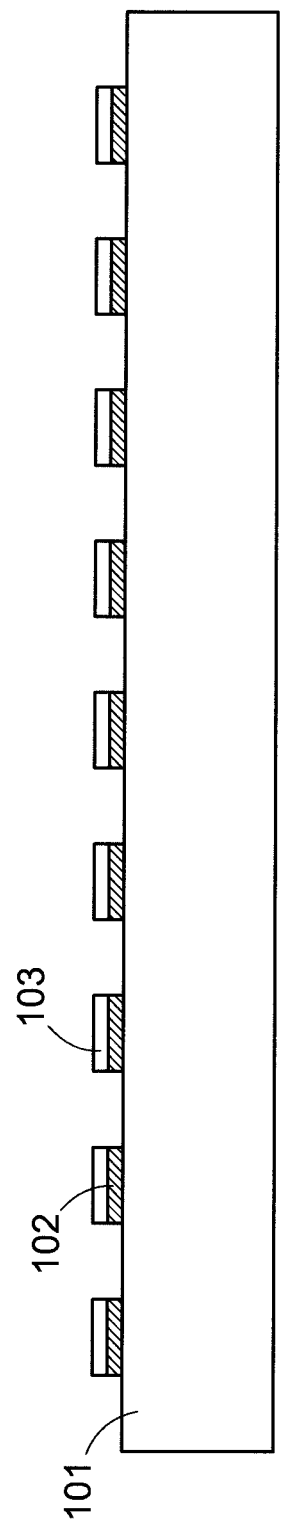
FIG. 3 is a cross-sectional view of a manufacturing process of a display device according to an embodiment of the present invention.

After the connecting electrode 102 is formed, in step S13, as shown in FIG. 3, an adhesive layer 103 is formed on the connecting electrode 102. The adhesive layer 103 is a layer made of a material having adhesiveness. Here, "having adhesiveness" means having the property that the material can be easily adhered to and peel off. In other words, when other materials are brought into contact with respect to the adhesive layer 103, other materials can be fixed on the adhesive layer 103 even if a weak force is applied. However, when a larger force is applied, other materials can be easily peeled off from the adhesive layer 103.

In this embodiment, a layer formed by coating a resin containing flux is used as the adhesive layer 103. When the resin containing flux is used as the adhesive layer 103, the flux component removes an oxide film formed on a surface of the connecting electrode 102. Therefore, the surface of the connecting electrode 102 can be activated, and stable joining with a terminal electrode 202, which will be described later, can be obtained. However, the present invention is not limited to this example, and for example, a resin layer containing a polymerization inhibitor can be used as the adhesive layer 103. When a polymerization inhibitor is mixed with a resin material, polymerization becomes insufficient when the resin is cured. Since the resin layer with insufficient polymerization has adhesiveness on its surface, it can be used as the adhesive layer 103 of this embodiment.

The thickness of the adhesive layer 103 may be within a range of, for example, 5 μm or less (preferably, 1 μm or more and 3 μm or less). As will be described later, the adhesive layer 103 is used as a layer for temporarily fixing the LED chip, and disappears during laser light irradiation process. Therefore, in order to reduce the component of the adhesive layer 103 remaining after the laser irradiation, it is desirable that the film thickness does not exceed 5 μm.

In the present embodiment, the adhesive layer 103 is formed only on the upper surface of the connecting electrode 102. That is, the adhesive layer 103 is not in contact with the circuit board 101. In the present embodiment, since the adhesive layer 103 is not arranged on the circuit board 101, the component of the adhesive layer 103 does not adversely affect the semiconductor element such as the thin-film transistors formed on the circuit board 101. As a method for forming the adhesive layer 103, a method capable of selectively forming the adhesive layer 103, such as a mask printing method or an inkjet method, is preferably used. However, the present invention is not limited to this example, a material having adhesiveness such as flux is applied to the entire surface such as a spin-coating, slit-coating, or the like, and then the adhesive layer 103 may be formed only on the upper surface of the connecting electrode 102 by lithography.

Figure 4:
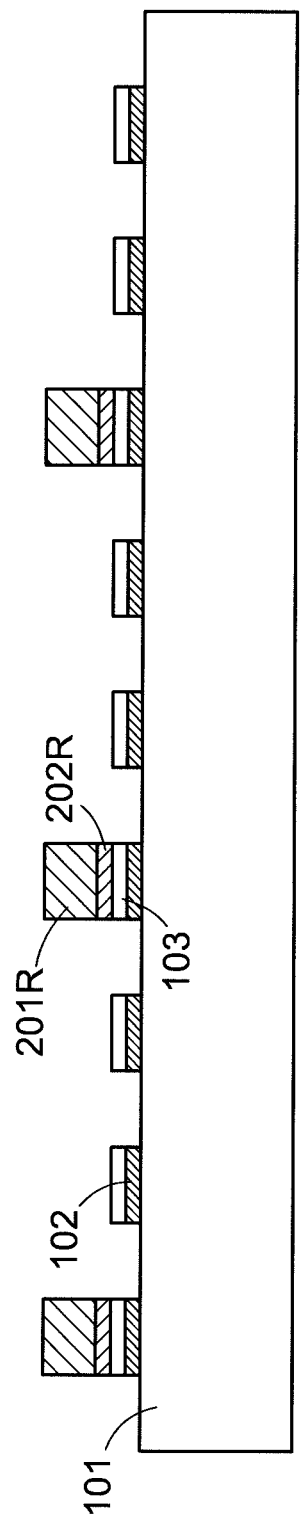
FIG. 4 is a cross-sectional view of a manufacturing process of a display device according to an embodiment of the present invention.

Next, in step S14, as shown in FIG. 4, mounting an LED chip 201R that emits red light on the circuit board 101. Specifically, first, a terminal electrode 202R of the LED chip 201R is adhered onto the adhesive layer 103. This allows the LED chip 201R to be temporarily fixed onto the connecting electrode 102. In the present embodiment, for simplifying the explanation, only one connecting electrode 102 and one terminal electrode 202R are shown, but in practice, two connecting electrodes 102 and two terminal electrodes 202R are provided for one LED chip 201R. However, when the face-up type LED chip described above is used as the LED chip 201, depending on the position of the terminal electrode of the LED chip 201, one connecting electrode 102 may be provided for each pixel.

The higher the definition of the display device, the more pixels are provided in the circuit board 101 and the smaller the size of each pixel. As the size of each pixel decreases, the size of the LED chip 201 arranged in each pixel also becomes minute, so that a method of transporting the LED chip 201 also becomes difficult. Therefore, when the LED chip 201 is placed directly on the connecting electrode 102 without using the adhesive layer 103, the LED chip 201 may fall from the connecting electrode 102 with a slight vibration.

In the present embodiment, in order to solve such a problem, the adhesive layer 103 is provided on the connecting electrode 102. That is, in the example shown in FIG. 4, it is possible to prevent the LED chip 201R from falling due to vibration by adhering the terminal electrode 202R of the LED chip 201R to the adhesive layer 103. In this case, the LED chip 201R does not need to be firmly adhered to, and the adhesive layer 103 may have an adhesive force sufficient for temporarily fixing. Therefore, after the LED chip 201R has adhered to the adhesive layer 103, the LED chip 201R can be easily peeled off before the laser light described later is irradiated, even if the LED chip 201R needs to be replaced.

Figure 5:
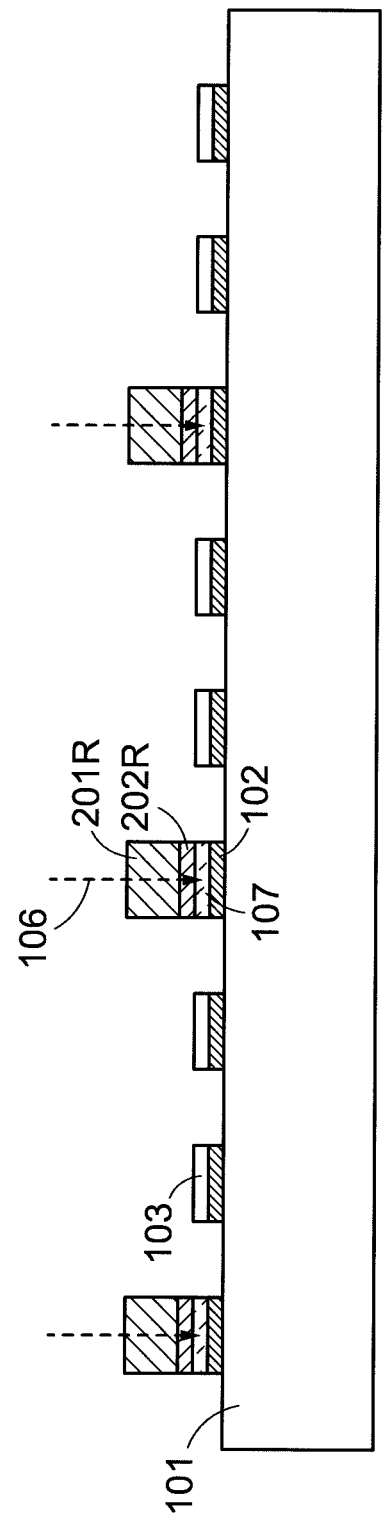
FIG. 5 is a cross-sectional view of a manufacturing process of a display device according to an embodiment of the present invention.

When the adhesion of the LED chip 201R is completed, in step S15, as shown in FIG. 5, the connecting electrode 102 and the terminal electrode 202R are joined by irradiating a laser light 106. This process is a process of melt-joining the connecting electrode 102 and the terminal electrode 202R by irradiating the laser light 106.

As the laser light 106, laser light that is not absorbed by the LED chip 201R and absorbed by the connecting electrode 102 or the terminal electrode 202R is selected. In the present embodiment, for example, infrared light or near-infrared light can be used as the laser light 106. As a light source of the laser light 106, a solid-state laser such as a YAG laser or a YVO$_4$ laser may be used. However, as the laser light 106, laser light of an appropriate wavelength can be selected depending on a semiconductor material that makes the LED chip 201R.

The adhesive layer 103 disappears by irradiation with the laser light 106. Instead, an alloy layer 107 made of a eutectic alloy is formed between the connecting electrode 102 and the terminal electrode 202R. As described above, in the present embodiment, the connecting electrode 102 is made of tin (Sn). On the other hand, the terminal electrode 202R is made of gold (Au). That is, in the present embodiment, a layer made of an Sn—Au eutectic alloy is formed as the alloy layer 107. However, as the connecting electrode 102 and the terminal electrode 202R, other metal materials may be used as long as a material capable of forming a eutectic alloy to each other. For example, both the connecting electrode 102 and the terminal electrode 202R may be made of tin (Sn).

By irradiating the laser light 106, the adhesive layer 103 disappears, and a part of the connecting electrode 102 and a part of the terminal electrode 202R are melted to form a eutectic alloy. The components of the adhesive layer 103 are dispersed in the eutectic alloy as carbon atoms. That is, carbons may be present inside the alloy layer 107, which is the junction between the connecting electrode 102 and the terminal electrode 202R, around the alloy layer 107, or around the connecting electrode 102 at a higher concentration than that of the connecting electrode 102 and the terminal electrode 202R.

For example, if an area of the connecting electrode 102 is greater than an area of the terminal electrode 202R of the LED chip 201R, in a surrounding area on which the alloy layer 107 has formed in a plan view, the surface of the connecting electrode 102 is exposed. In this case, on the surface of the exposed connecting electrode 102, carbons generated by the disappearance of the adhesive layer 103 are present at a higher concentration than that of the terminal electrode 202R. The carbon concentration on the surface of the exposed connecting electrode 102 is higher than the carbon concentration on a back surface (a surface on the circuit board 101 side) of the connecting electrode 102. Further, the adhesive layer 103 may not completely disappear when the laser light 106 is irradiated may remain around the alloy layer 107, for example, on the surface of the exposed connecting electrode 102.

As described above, by forming the alloy layer 107 made of the eutectic alloy between the connecting electrode 102 and the terminal electrode 202R, the connecting electrode 102 and the terminal electrode 202R are joined via the alloy layer 107. As a result, the LED chip 201R can be firmly implemented to the connecting electrode 102.

Figure 6:
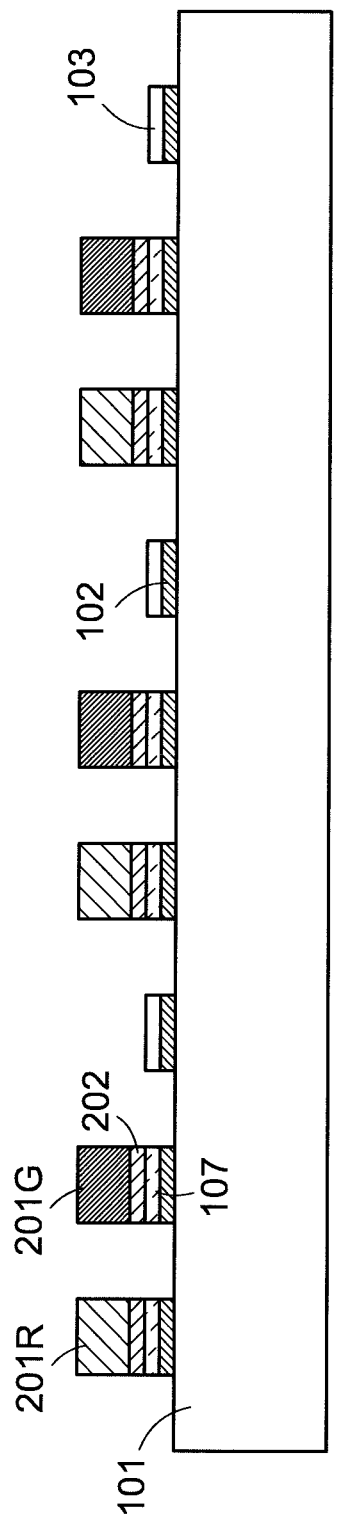
FIG. 6 is a cross-sectional view of a manufacturing process of a display device according to an embodiment of the present invention.

After implementing the LED chip 201R that emits red light by the process of FIGS. 4 and 5, next, as shown in FIG. 6, an LED chip 201G that emits green light is implemented to the circuit board 101. In the implementation of the LED chip 201G as well, as described above, the laser light 106 is irradiated onto the adhesive layer 103 with a terminal electrode 202G adhered thereto. Thus, the connecting electrode 102 and the terminal electrode 202G is firmly joined via the alloy layer 107.

Figure 7:
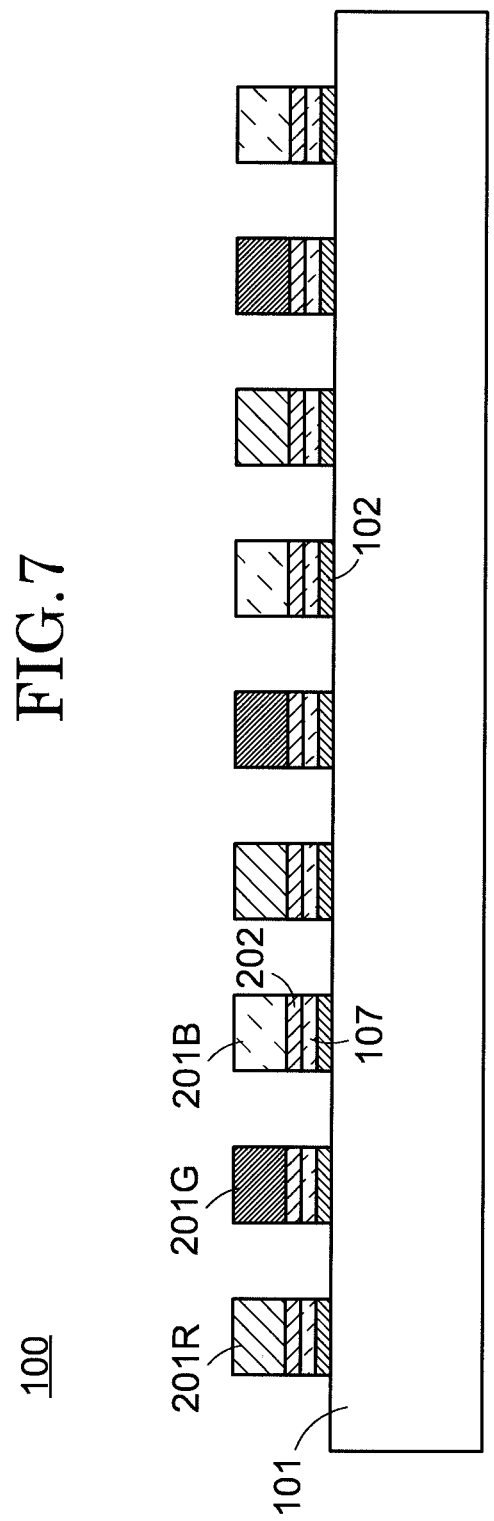
FIG. 7 is a cross-sectional view of a manufacturing process of a display device according to an embodiment of the present invention.

Finally, as shown in FIG. 7, an LED chip 201B that emits blue light is implemented to the circuit board 101. In the implementation of the LED chip 201B as well, as described above, the laser light 106 is irradiated onto the adhesive layer 103 with a terminal electrode 202B adhered thereto. Thus, the connecting electrode 102 and the terminal electrode 202B is firmly joined via the alloy layer 107.

In the present embodiment, an example of implementing the LED chip 201R, the LED chip 201G, and the LED chip 201B on the circuit board 101 in this order is shown. However, not limited to this example, the order of implementation may be appropriately determined as needed.

As described above, in the manufacturing method of the present embodiment, the connecting electrode 102 on the circuit board 101 side and the terminal electrode 202 on the LED chip 201 side are connected using a melt-joining by irradiation with the laser light 106. In this case, the adhesive layer 103 is formed on the connecting electrode 102 in advance, and the LED chip 201 is detachably adhered to the connecting electrode 102. As a result, the LED chip 201 can be maintained in a fixed state on the connecting electrode 102 until the laser light 106 is irradiated.

According to the present embodiment, since the LED chip 201 can be fixed until the laser light 106 is irradiated, it is possible to prevent the misregistration of the LED chip 201. Also, as described above, when using a resin containing flux as the adhesive layer 103, it is possible to remove the oxide film on the surface of the connecting electrode 102, so that the occurrence of joining defects when joining the terminal electrode 202 to the connecting electrode 102 can be reduced.

Further, in the present embodiment, since the adhesive layer 103 is provided only on the upper surface of the connecting electrode 102, no component (e.g., alkaline components) of the adhesive layer 103 remains on the circuit board 101, and it is possible to prevent defects due to the component of the adhesive layer 103. In addition to this, when providing the adhesive layer 103 only on the upper surface of the connecting electrode 102, the adhesive layer 103 does not affect the translucent performance of the display device 100, so that it is also possible to realize a transparent display.

As described above, according to the manufacturing method of the present embodiment, it is possible to join the LED chip to the circuit board by a simple method while preventing the misregistration of the LED chip.

[Configuration of Display Device]

Referring to FIGS. 8 to 11, the configuration of the display device 100 according to an embodiment of the present invention will be described.

Figure 8:
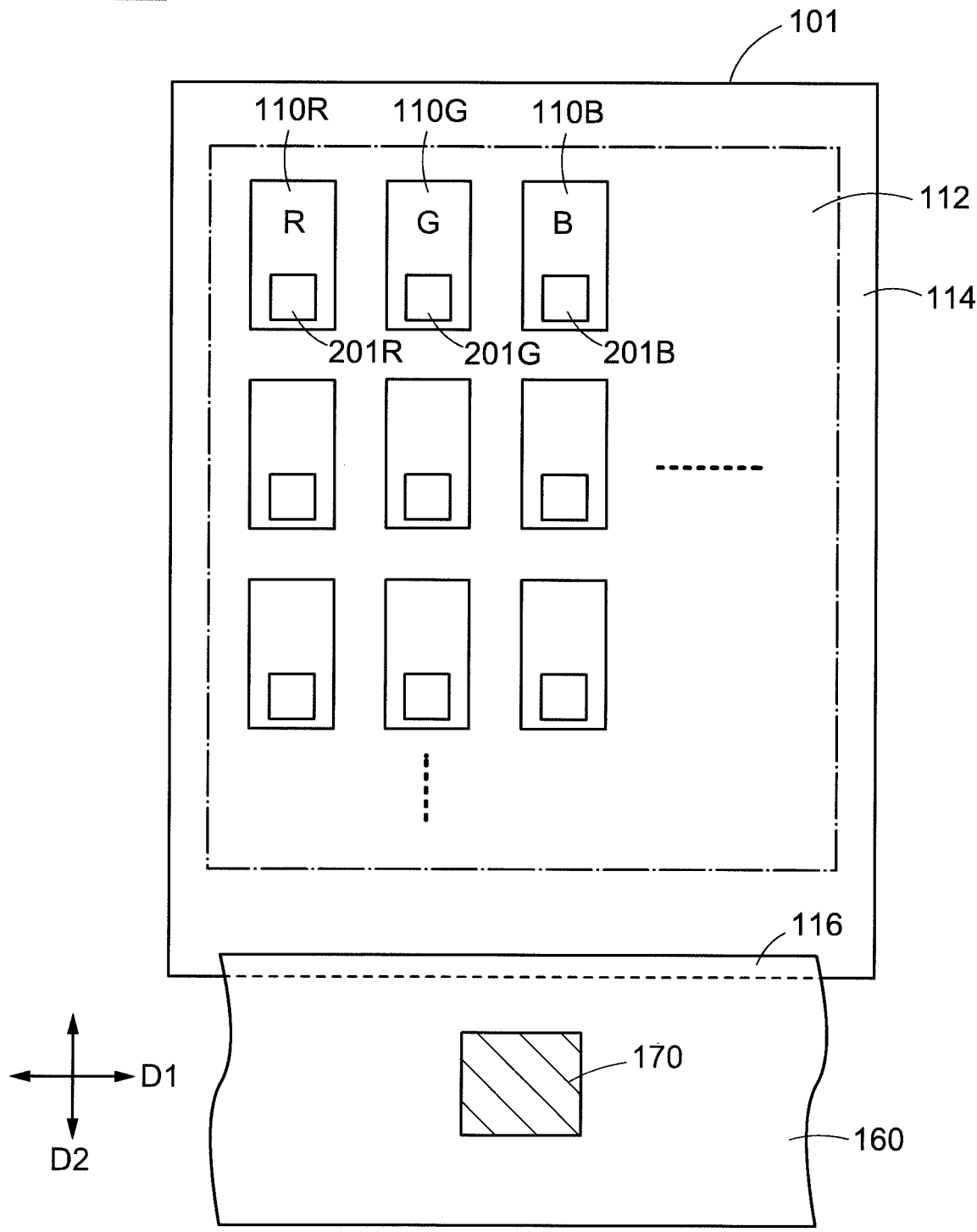
FIG. 8 is a plan view of a schematic configuration of a display device according to an embodiment of the present invention.

FIG. 8 is a plan view showing a schematic configuration of the display device 100 according to an embodiment of the present invention. As shown in FIG. 8, the display device 100 has the circuit board 101, a flexible printed circuit board 160 (FPC160), and an IC chip 170. The display device 100 is divided into a display region 112, a peripheral region 114, and a terminal region 116.

The display region 112 is a region in which a plurality of pixels 110 including the LED chip 201 is arranged in the row direction (D1 direction) and the column direction (D2 direction). Specifically, in the present embodiment, a pixel 110R including the LED chip 201R, a pixel 110G including the LED chip 201G, and a pixel 110B including the LED chip 201B are arranged. The display region 112 functions as a region for displaying an image corresponding to a video signal.

The peripheral region 114 is a region around the display region 112. The peripheral region 114 is a region provided with a driver circuit (a data driver circuit 130 and a gate driver circuit 140 shown in FIG. 9) for controlling the pixel circuit provided in each pixel 110 (a pixel circuit 120 shown in FIG. 9).

The terminal region 116 is a region where a plurality of wirings connected to the above-mentioned driver circuit is integrated. The flexible printed circuit board 160 is electrically connected to the plurality of wirings in the terminal region 116. The video signal (data signal) or control signal output from an external device (not shown) is input to the IC chip 170 via the wiring (not shown) provided in the flexible printed circuit board 160. The IC chip 170 performs various signal processing on the video signal and generates the control signal required for display control. The video signal and control signal output from the IC chip 170 is input to the display device 100 via the flexible printed circuit board 160.

[Circuit Configuration of Display Device 100]

Figure 9:
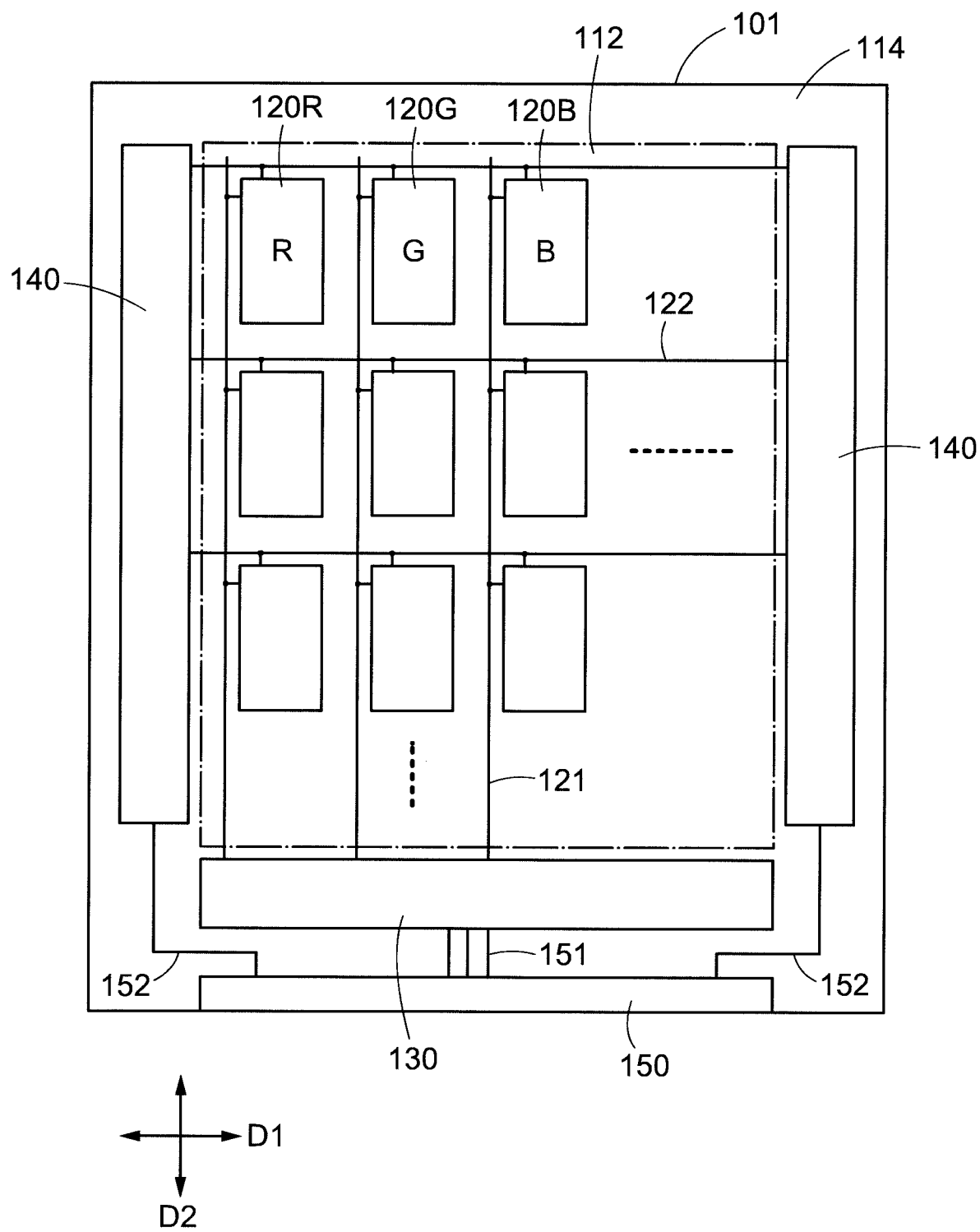
FIG. 9 is a block diagram of a circuit configuration of a display device according to an embodiment of the present invention.

FIG. 9 is a block diagram showing a circuit configuration of the display device 100 according to an embodiment of the present invention. As shown in FIG. 9, the display region 112 is provided with the pixel circuit 120 according to each pixel 110. In the present embodiment, corresponding to the pixel 110R, the pixel 110G, and the pixel 110G, a pixel circuit 120R, a pixel circuit 120G, and a pixel circuit 120B are respectively provided. That is, a plurality of pixel circuits 120 is arranged in the row direction (D1 direction) and the column direction (D2 direction) in the display region 112.

Figure 10:
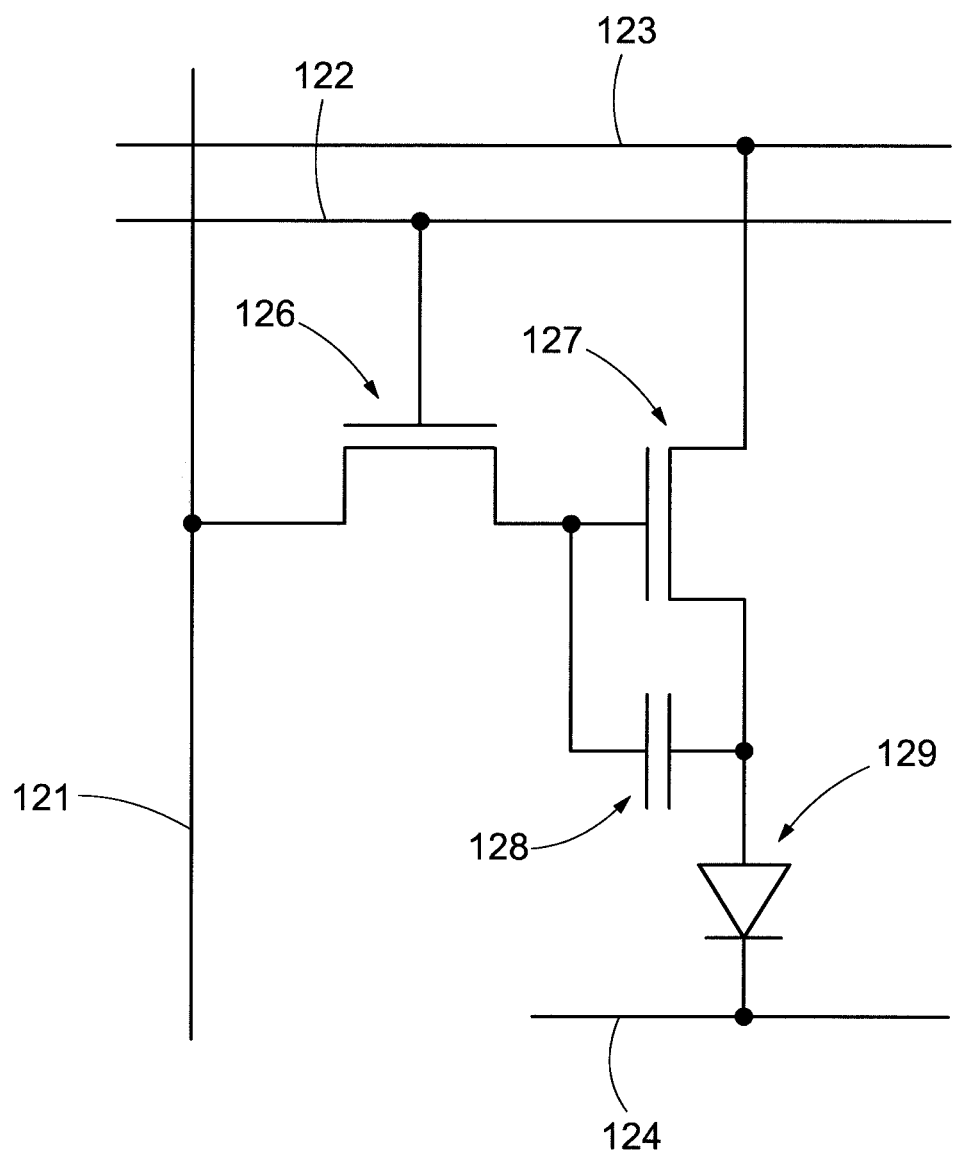
FIG. 10 is a circuit diagram of a configuration of a pixel circuit of a display device according to an embodiment of the present invention.

FIG. 10 is a circuit diagram showing a configuration of the pixel circuit 120 of the display device 100 according to an embodiment of the present invention. The pixel circuit 120 is arranged in a region surrounded by a data line 121, a gate line 122, an anode power line 123, and a cathode power line 124. The pixel circuit 120 of the present embodiment includes a select transistor 126, a drive transistor 127, a storage capacity 128 and an LED 129. The LED 129 corresponds to the LED chip 201 shown in FIG. 8. Of the pixel circuit 120, the circuit elements other than the LED 129 are provided in the circuit board 101. That is, the individual pixel circuit 120 corresponds to the plurality of circuit elements in the drive circuit driving the LED chip 201. Therefore, the pixel circuit 120 is completed in a state that the LED chip 201 is implemented to the circuit board 101.

As shown in FIG. 10, each of the source electrode, gate electrode, and drain electrode of the select transistor 126 are connected to the data line 121, the gate line 122, and the gate electrode of the drive transistor 127, respectively. Each of the source electrode, gate electrode, and drain electrode of the drive transistor 127 are connected to the anode power line 123, the drain electrode of the select transistor 126, and the LED 129, respectively. The storage capacity 128 is connected between the gate electrode and drain electrode of the drive transistor 127. That is, the storage capacity 128 is connected to the drain electrode of the select transistor 126. An anode and a cathode of the LED 129 connect to the drain electrode of the drive transistor 127 and the cathode power line 124, respectively.

The data line 121 is supplied with a gradation signal for determining the emission intensity of the LED 129. The gate line 122 is supplied with a gate signal for selecting the select transistor 126 that writes the gradation signal. When the select transistor 126 is turned on, the gradation signal is accumulated in the storage capacity 128. Thereafter, when the drive transistor 127 is turned on, a driving current corresponding to the gradation signal flows through the drive transistor 127. When the driving current output from the drive transistor 127 is input to the LED 129, the LED 129 emits light with the emission intensity corresponding to the gradation signal.

Referring again to FIG. 9, a data driver circuit 130 is arranged at a position adjacent to the display region 112 in the column direction (D2 direction). Further, gate driver circuits 140 are arranged at positions adjacent to the display region 112 in the row direction (D1 direction). In the present embodiment, the gate driver circuits 140 are provided on both sides of the display region 112, but only one of them may be provided.

The data driver circuit 130 and the gate driver circuits 140 are arranged in the peripheral region 114. However, the region for arranging the data driver circuit 130 is not limited to the peripheral region 114. For example, the data driver circuit 130 may be arranged in the flexible printed circuit board 160.

The data line 121 shown in FIG. 10 extends from the data driver circuit 130 to the D2 direction and is connected to the source electrode of the select transistor 126 in each pixel circuit 120. The gate line 122 extends from the gate driver circuits 140 to the D1 direction and is connected to the gate electrode of the select transistor 126 in each pixel circuit 120.

In the terminal region 116, a terminal part 150 is arranged. The terminal part 150 is connected to the data driver circuit 130 via a connecting wiring 151. Similarly, the terminal part 150 is connected to the gate driver circuits 140 via connecting wirings 152. In addition, the terminal part 150 is connected to the flexible printed circuit board 160.

[Cross-Sectional Structure of Display Device 100]

Figure 11:
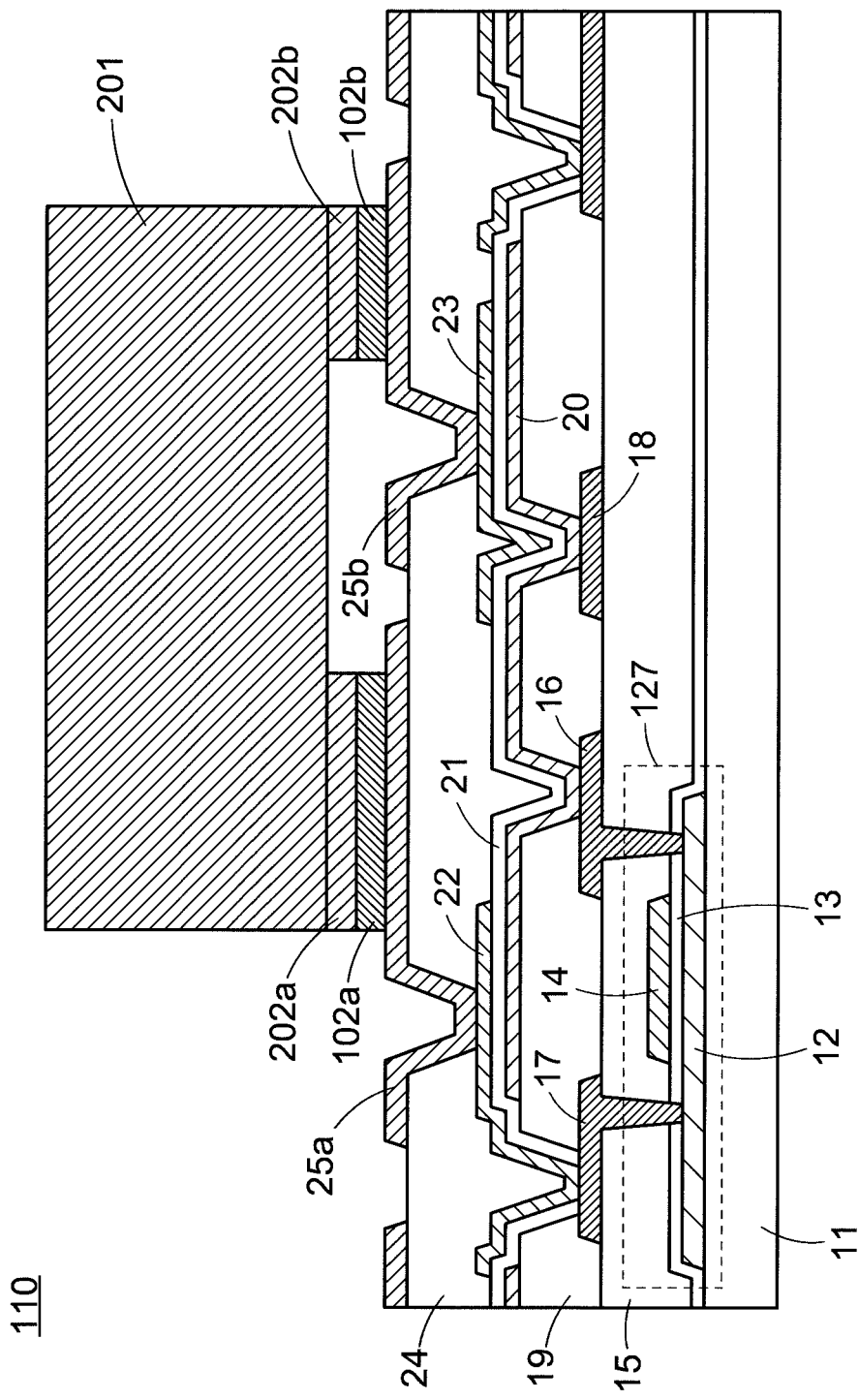
FIG. 11 is a cross-sectional view of a configuration of a pixel of a display device according to an embodiment of the present invention.

FIG. 11 is a cross-sectional view showing a configuration of the pixel 110 of the display device 100 according to an embodiment of the present invention. As described with reference to FIG. 10, the pixel 110 has the drive transistor 127 provided over an insulating substrate 11. As the insulating substrate 11, a glass substrate or a substrate having an insulating layer on a resin substrate can be used.

The drive transistor 127 includes a semiconductor layer 12, a gate insulating layer 13, and a gate electrode 14. The semiconductor layer 12 is connected to a source electrode 16 and a drain electrode 17 via an insulating layer 15. Although not shown, the gate electrode 14 is connected to the drain electrode of the select transistor 126 shown in FIG. 10.

A wiring 18 is provided in the same layer as the source electrode 16 and the drain electrode 17. The wiring 18 functions as the anode power line 123 shown in FIG. 10. Therefore, the source electrode 16 and the wiring 18 are electrically connected by a connecting wiring 20 provided on a planarizing layer 19. The planarizing layer 19 is a transparent resin layer using a resin material such as polyimide or acrylic. The connecting wiring 20 is a transparent conductive layer using a metal oxide material such as an ITO. However, the present invention is not limited to this example, and other metal materials may be used as the connecting wiring 20.

Above the connecting wiring 20, an insulating layer 21 made of silicon nitride or the like is provided. Above the insulating layer 21, an anode electrode 22 and a cathode electrode 23 are provided. In the present embodiment, the anode electrode 22 and the cathode electrode 23 are transparent conductive layers using the metal oxide material such as the ITO. The anode electrode 22 is connected to the drain electrode 17 via an opening provided in the planarizing layer 19 and the insulating layer 21.

The anode electrode 22 and the cathode electrode 23 are connected to mounting pads 25a and 25b via a planarizing layer 24, respectively. The mounting pads 25a and 25b are made of, for example, a metal material such as tantalum or tungsten. Connecting electrodes 102a and 102b are provided on the mounting pads 25a and 25b, respectively. The connecting electrodes 102a and 102b correspond to the connecting electrode 102 shown in FIG. 7, respectively. That is, in the present embodiment, electrodes made of tin (Sn) are arranged as the connecting electrodes 102a and 102b.

Terminal electrodes 202a and 202b of the LED chip 201 are joined to the connecting electrodes 102a and 102b, respectively. As described above, in the present embodiment, the terminal electrodes 202a and 202b are electrodes made of gold (Au). Here, focusing on the connecting electrode 102a and the terminal electrode 202a, an alloy layer not shown (the alloy layer 107 shown in FIG. 5) exists between the connecting electrode 102a and the terminal electrode 202a, as described with reference to FIG. 5. Further, in the present embodiment, in the alloy layer which is the junction between the connecting electrode 102a and the terminal electrode 202a, and the periphery thereof (for example, the surface of the connecting electrode 102a exposed to the periphery of the alloy layer), the carbon is present in higher concentration than the carbon inside the connecting electrode 102a, the back surface of the connecting electrode 102a (the surface on the circuit board 101 side), and the terminal electrode 202a. Further, for example, the adhesive layer 103 may remain on the surfaces of the mounting pads 25a and 25b or a part of the surface of the connecting electrode 102a without disappearing. Carbon may also be present on the surface of the mounting pads 25a and 25b at a higher concentration than the concentration of the back surface of the mounting pads 25a and 25b (the surface of the planarizing layer 24 side). Although the connecting electrode 102a and the terminal electrode 202a have been described above, the same applies to the connecting electrode 102b and the terminal electrode 202b.

The LED chip 201 corresponds to the LED 129 in the circuit diagram shown in FIG. 10. That is, the terminal electrode 202a of the LED chip 201 is connected to the anode electrode 22 connected to the drain electrode 17 of the drive transistor 127. The terminal electrode 202b of the LED chip 201 is connected to the cathode electrode 23. The cathode electrode 23 is electrically connected to the cathode power line 124 shown in FIG. 10.

The display device 100 of the present embodiment having the above structure has the advantage that it has high resistance to impacts and the like because the LED chip 201 is firmly implemented by melt-joining by laser irradiation. In the present embodiment, the melt-joining is performed in a state where the LED chip 201 is temporarily fixed on the connecting electrodes 102a and 102b, so that there is the advantage that the misregistration of the LED chip 201 is exceedingly small.

(Modification 1)

In the above embodiment, an example in which the adhesive layer 103 is arranged only on the upper surface of the connecting electrode 102 has been described, but the present invention is not limited to this example. For example, in a plan view, the adhesive layer 103 may be formed to be larger than the connecting electrode 102, and the adhesive layer 103 may be formed to cover the upper surface and the side surface of the connecting electrode 102.

(Modification 2)

In the embodiment described above, an example of joining the connecting electrode 102 and the terminal electrode 202 using the melt-joining by laser irradiation has been shown but is not limited to this example. For example, the connecting electrode 102 and the terminal electrode 202 may be joined by using liquid-phase joining such as a solder or the like. In this case, according to the present embodiment, the LED chip 201 can be temporarily fixed on the connecting electrode 102 during the liquid-phase joining process. At that time, since the adhesive layer 103 disappears by the heat when the solder or the like is melted, it does not impair the electrical connection between the connecting electrode 102 and the terminal electrode 202.

Each of the embodiments and modifications described above as the embodiments of the present invention can be appropriately combined and implemented as long as they do not contradict each other. It is also within the scope of the present invention that a skilled in the art adds, deletes, or changes the design of constituent elements, or adds, omits, or changes the conditions of steps as appropriate based on each of the embodiments and modifications as long as the gist of the present invention is provided.

Even if it is other working effects which is different from the working effect brought about by the mode of each above-mentioned embodiment, what is clear from the description in this Description, or what can be easily predicted by the person skilled in the art is naturally understood to be brought about by the present invention.

What is claimed is:

1. A method for manufacturing a display device comprising:
   preparing a circuit board including a drive circuit for driving a LED chip;
   forming a connecting electrode on the circuit board;
   forming an adhesive layer by a resin containing a flux on the connecting electrode;

adhering a terminal electrode of the LED chip on the adhesive layer; and joining the connecting electrode and the terminal electrode by irradiating a laser light.

2. The method for manufacturing a display device according to claim 1, wherein the adhesive layer is formed only on an upper surface of the connecting electrode.

3. The method for manufacturing a display device according to claim 1, wherein the laser light is a near-infrared light.

4. The method for manufacturing a display device according to claim 1, wherein the laser light is a light emitted from a solid-state laser.

5. A method for manufacturing a display device comprising:

preparing a circuit board including a drive circuit for driving a LED chip;

forming a connecting electrode on the circuit board;

forming an adhesive layer by a resin containing a polymerization inhibitor on the connecting electrode;

adhering a terminal electrode of the LED chip on the adhesive layer; and joining the connecting electrode and the terminal electrode by irradiating a laser light.

6. The method for manufacturing a display device according to claim 5, wherein the adhesive layer is formed only on an upper surface of the connecting electrode.

7. The method for manufacturing a display device according to claim 5, wherein the laser light is a near-infrared light.

8. The method for manufacturing a display device according to claim 5, wherein the laser light is a light emitted from a solid-state laser.

* * * * *